United States Patent [19]

Adachi

[11] 4,247,600
[45] Jan. 27, 1981

[54] METALLIZED PLASTIC CAMERA HOUSING AND METHOD

[75] Inventor: Iwao P. Adachi, Westminster, Calif.
[73] Assignee: Minolta Camera Kabushiki Kaisha, Osaka, Japan
[21] Appl. No.: 928,802
[22] Filed: Jul. 28, 1978
[51] Int. Cl.³ .................. B21C 37/00; C25D 7/04
[52] U.S. Cl. .................. 428/607; 428/624; 428/226; 354/228
[58] Field of Search ............ 428/607, 624, 226; 354/228

[56] References Cited

U.S. PATENT DOCUMENTS

| | | | |
|---|---|---|---|
| 3,558,290 | 1/1971 | Baies et al. | 428/626 |
| 3,771,977 | 11/1973 | Liu | 428/626 |
| 3,930,807 | 1/1976 | Kobayashi et al. | 428/626 |
| 3,984,907 | 10/1976 | Vossen et al. | 428/626 |
| 4,042,752 | 8/1977 | Hage | 428/626 |
| 4,101,402 | 7/1978 | Vossen et al. | 428/626 |

Primary Examiner—Brooks H. Hunt
Attorney, Agent, or Firm—Jackson, Jones & Price

[57] ABSTRACT

An improved plastic camera housing having an exterior decorative metallic coating and method of producing the same is disclosed. The camera housing assembly can comprise a polycarbonate glass fiber filled molded part that has been plasma etched in an inert argon gas filled pressure vessel. The camera part is plasma etched for a brief period of time to deteriorate the cross linkage of plastic bonding of the surface polymers without causing any outgassing of the elements of the plastic. A layer of copper is deposited to an approximate thickness of 1 to 3 microns in the inert subatmospheric environment. A second exterior layer of chromium approximately 0.2 to 0.5 microns is subsequently deposited to provide a hard abrasion resistant surface. Alternatively, a lacquer subsurface layer can be sprayed onto the camera part before the initial plasma etching.

11 Claims, 4 Drawing Figures

METALLIZED PLASTIC CAMERA HOUSING AND METHOD

BACKGROUND OF THE INVENTION

1. Field of the Invention

The present invention is directed to a camera housing assembly and method of making the same and more particularly to a plastic camera housing assembly having an abrasion resistant metallic coating.

2. Description of the Prior Art

Camera housings have been made from diverse forms of material over the history of photography. The initial materials selected were primarily designed to provide a relatively lightweight camera structure while insuring that the interior of the camera was kept free of any undesired light. While these requirements are still germane to the present modern day camera, additional and more complex requirements have been added. The high labor cost associated with the assembling of the more expensive 35 mm cameras has required the camera manufacturers to seek alternative methods of providing housing assemblies. Heretofore, the quality required in the higher priced cameras has been met by the use of metal camera bodies. The economies presented with the use of plastic injection molding is now attracting the manufacturers of expensive cameras to switch to plastic camera housing assemblies.

Originally, cameras were made of wood and fiberboard frequently covered with cloth. Subsequently, sheet metal, aluminum and zinc die cast parts were utilized. In 1934, Eastman Kodak Company introduced their first Brownie camera molded from phenolics. Today most fixed focus cameras have become all plastic. Various types of plastic such as cellulosics, polyethylene, Nylon, phenolics, styrenes, epoxies and metacrylates have been utilized. Additionally, in the photographic field there has been suggestions to utilize high density polyethylene, high impact styrene alloy, melamine, vinyl-aluminum laminates, Nylatron (filled nylon), Fiberfil (glass-filled styrene), Delrin acetal resin and Lexan polycarbonate.

The photography industry has also attempted to utilize metal coatings on various camera component parts. For example, the Kodak Lumaclad reflector was made of a Tenite butyrate plastic shell that had been vacuum-metallized to provide a reflecting surface. For a further discussion of the use of plastics in the photography field, reference is made to Modern Plastics (April 1960) pages 102-103.

While plastic has been utilized in the relatively inexpensive fixed focus camera bodies, there has been a recognition that problems can exist with the use of plastics in the proper alignment and positioning of lenses. Various patents have suggested the use of plastic housings with a concern for the positioning of metal inserts to insure the optical centering of lenses, such as the Fay U.S. Pat. Nos. 2,559,860 and 2,559,861 and the German Auslegeschrift No. 1,147,839 (1963).

One of the acute problems that exist in converting the camera housing assemblies of the more expensive 35 mm cameras to plastic is to insure that the purchaser still perceives that he is receiving a quality product. In this regard, the use of metallized coatings on the exterior of the camera body has been suggested.

As is known, plastic has a relatively low melting point and will deform if it is heated above 300° F. Preferably, the plastic camera part should not be heated above 165° F. Without heating, however, it is difficult to achieve a strong adhesive coating of a metal. A further problem occurs in utilizing a vacuum since the heating of the plastic will produce various gases that will itself react and leave undesirable by-products on the surface of the camera part.

Generally, the prior art has resorted to aluminizing at a $10^{-3}$ torr vacuum where the aluminum is flash evaporated onto the plastic part. Usually the aluminum film will be about 0.1 microns and will be subsequently sandwiched between the plastic camera part and an exterior top plastic coating. The top plastic coating is usually clear, however, it can be tinted to appear as gold, silver or other decorative color.

The reflectiveness of this aluminized coating is not a duplicate of real metal because of the top protective coating of plastic. Additionally, the exterior plastic coating is not abrasion resistant. Both the exterior plastic coating and the aluminum itself is relatively soft and can be easily abraded.

Finally, the thermal conductance of the plastic coating is low compared to that of real metal and, therefore, it produces a different tactile feeling to the user of the camera.

While it has been recognized that it would be highly desirable to provide an abrasion resistant metal coating, the adhesion of a metal coating to a plastic substrate has been difficult to achieve. Again, the thermal problems dealing with the plastic has created certain barriers. The discrepancy in the coefficients of thermal expansion between metal and plastic has created cracks when the camera housing is utilized in wide extremes of ambient temperature.

Thus, there is a demand in the prior art to provide a high quality metallized plastic camera housing that will maintain the quality that camera purchasers have expected of fairly sophisticated 35 mm cameras.

SUMMARY OF THE INVENTION

An improved plastic camera housing having an exterior metallized decorative coating and method of achieving the same is provided. The camera housing assembly part can be formed from a glass fiber filled plastic such as polycarbonate although other plastics can be used. The plastic housing part can be pretreated with a lacquer or plastic sub-coating such as a polyurethane based resin with carbon powder, graphite powder, copper powder, or chromium powder added thereto in the size range of 1 to 5 microns. A magnetron process is utilized for both pretreating the plastic housing and for the sputtering depositing of a soft intermediate layer of metal to assist in the adhesion of a hard exterior metal coating. The camera housing surface is preliminarily plasma etched in an environment of argon gas at a pressure of $10^{-2}$ torr for a period of about two minutes.

Subsequently, while still maintaining the argon gas environment, copper is sputtered onto the prepared surface to a thickness of approximately 1 to 3 microns. Finally, chromium is subsequently sputtered in the same environment to provide the abrasion resistant exterior coating of approximately 0.3 microns. The housing part can be rotated, during sputtering, to further insure that it is kept at a relatively cool condition below 165° F. The rotation also reduces the sputtering rate required compared to that of a stationary sputtering condition.

The objects and features of the present invention, which are believed to be novel, are set forth with particularity in the appended claims. The present invention, both as to its organization and manner of operation, together with further objects and advantages thereof, may best be understood by reference to the following description, taken in connection with the accompanying drawings.

DESCRIPTION OF THE PREFERRED EMBODIMENTS

The following description is provided to enable any person skilled in the camera industry to make and use the invention and sets forth the best modes contemplated by the inventor of carrying out his invention. Various modifications, however, will remain readily apparent to those skilled in the art, since the generic principles of the present invention have been defined herein specifically to provide a relatively economical camera housing assembly and process for producing the same.

Figure 1:
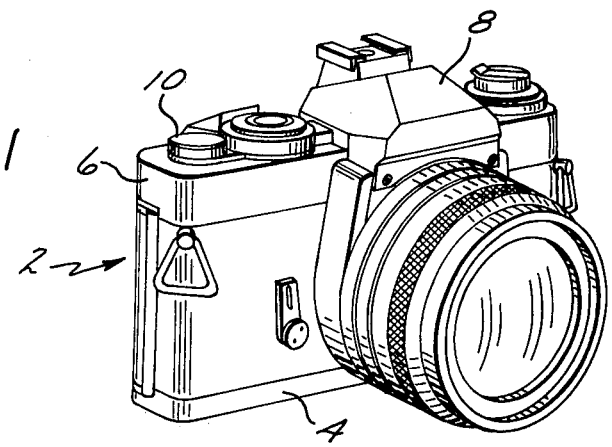
FIG. 1 is a perspective view of a camera housing with a metallized coating.

Referring to FIG. 1, a 35 mm camera housing assembly 2, is disclosed. The bottom portion or base plate member 4 and the upper housing or cowling 6 have exterior metallized coatings. Additionally, the prism cover 8 and even some of the knobs 10 can be made from a plastic material with a time-saving injection molding process and then subsequently receive the metallized coating of the present invention. As can be readily imagined, the specific component parts of the camera housing assembly can be subjectively determined as to which parts will receive the exterior metallized coating. Those parts disclosed in FIG. 1 are generally the parts that the camera user has come to expect as containing a decorative metal finish. Other camera housing parts could just as easily receive the metallized coating.

Due to the problems of adhering the metallized coating on a plastic substrate, such as relative heat expansion that can cause cracks in the metal coating during use, and the susceptibility of the metallized coating to scratches and abrasions, the prior art has generally resorted to a flash aluminum evaporation method to provide a metallized coating. Additionally, a wet process has also been used wherein liquid nickel, copper, chromium can be deposited up to 30 to 40 microns in thickness.

Figure 2:
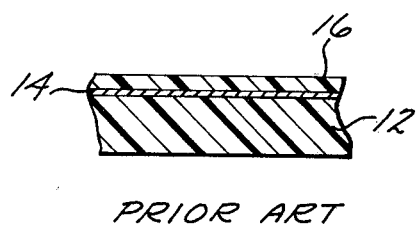
FIG. 2 is a schematic cross-sectional view of the prior art aluminum coating on camera parts.

Referring to FIG. 2, the prior art aluminum layer is disclosed wherein the plastic substrate 12 has a layer 14 of evaporated aluminum film of about 0.1 microns deposited on the substrate 12. To protect this aluminum film, a top plastic coating 16 is subsequently deposited on top of the aluminum film.

In accordance with the present invention, the metallized exterior coating is provided on a plasma etched plastic substrate surface and includes an underlayer of copper supporting the exterior chromium finish. While copper and chromium are preferred, it is believed that other transitional elements could also be used.

Figure 3:
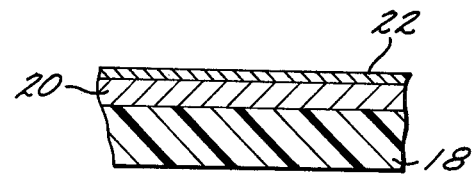
FIG. 3 is a schematic cross-sectional view of a metallized coating for the camera housing of the present invention.

Referring to FIG. 3, a schematic cross-sectional illustration of the plastic camera housing having a metallized coating is disclosed. The subjectively molded plastic substrate part 18 has had its surface prepared for adhering to a metal coating by plasma etching. In this regard, the substrate part 18 has been placed in an inert gas atmosphere, such as argon gas, at a pressure of approximately $10^{-2}$ torr for approximately two minutes. This plasma etching time is believed sufficient to deteriorate the cross linkage of bonds between the plastic polymers adjacent the surface without any outgassing of any significant plastic elements that could produce by-products that would effect the subsequent coating of the substrate. This plasma etching can occur in a commerically available Industrial Vacuum magnetron or a Sloan plane magnetron. The plasma etching for a period of two minutes is accomplished at 13.6 megahertz at 500 watts power. The size of the plane magnetron target is 15×22.5 centimeters and the part is located 13 centimeters above the target. The source gas flow rates as well as contaminant outgassing rates and leak rates can be adjusted to maintain the appropriate pressure while preventing contamination of the deposited metallic layer as is well known by a person skilled in this field.

After this preparatory plasma etching step, copper is sputtered onto the plastic substrate 18 for approximately two minutes to produce a thickness of 1 micron. This copper layer 20 can be between 1 to 3 microns in thickness and can be deposited at 600 volts and 1 amp. Additional copper can be deposited if desired, but 1 to 3 microns has been successfully utilized and most importantly reduces the processing time to coat the plastic substrate while providing a highly desirable finished product. The copper sputtering is performed in the pressure vessel surrounding the magnetron in the environment of the argon gas at a pressure of $10^{-2}$ torr.

Immediately after the depositing of the copper layer 20, a layer of chromium 22 having a thickness of about 0.3 microns is deposited on top of the copper. The chromium can be sputtered at 500 volts and 1 amp for approximately four minutes. Preferably 0.2 to 0.5 microns of chromium are deposited on top of the copper layer again in the same low vacuum atmosphere of argon.

Since the sputtering is conducted under a pressure of $10^{-}$ to $10^{-}$ torrs of argon gas, there is no problem of outgassing from the plastic substrate. Additionally, this magnetron sputtering is relatively a cool method and does not excessively heat the plastic substrate. The experimental cycle of operation, from locating the plastic substrate in the pressure vessel, evacuating the pressure vessel, applying the argon gas pressure and sputtering the metal film of copper and chromium to a desired thickness requires approximately 20 to 30 minutes. It is believed that further requirements can be made in this process in a commercial environment.

The selection of copper as the intermediate sublayer was utilized since it had a relatively strong adhesion to the plastic substrate, as well as a fast sputtering rate. Chromium was selected to provide an extremely hard and resistant to abrasion, final exterior coating with good reflective properties. The chromium adheres to copper extremely well and the resulting combinations of the metal provide a heretofore unavailable superior metallized finish on a plastic camera housing assembly.

While the present invention process has been disclosed for use on a camera housing, because it is believed to be unique in this field, it should be readily realized that other plastic substrates could advantageously receive the metallized coating of the present invention for use in other fields.

Figure 4:
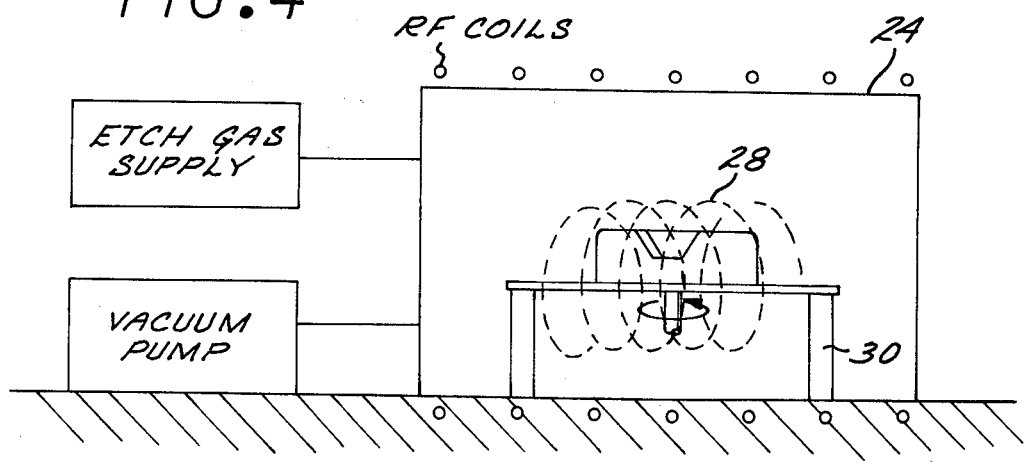
FIG. 4 is a schematic of the magnetron sputtering process apparatus.

Referring to FIG. 4, a schematic of the magnetron sputtering equipment is disclosed and an explanation of its component parts will be combined with a description of a second embodiment of the present invention.

An alternative second method of providing a metallized coating on a plastic substrate can utilize a plastic sublayer coating applied by a sprayer prior to inserting the part into the magnetron. This sublayer coating can further improve the final product by first protecting the surface design characteristics of the molded part and further homogenizing the surface condition. Frequently the injection molded plastic part will have internal stresses near its gate and an inhomogenous surface condition.

Various sublayer coatings have been utilized such as a polyurethane coating that is commercially sold as Red Spot No. 201SL18752. This is a black lacquer material that is combined on a ratio of eight parts of black lacquer base to one part of a catalyst that is commerically sold as No. 197SL 16616. This mixture of black lacquer and catalyst is further mixed with a solvent thinner that is commerically sold as No. SV3251. The black lacquer and catalyst mixture is thinned on a ratio of one part to twenty parts of thinner. The resulting mixture can then be applied by a sprayer to a thickness of approximately 5 microns and then force air dried for 30 minutes at a temperature of 165° F. Other sublayer coatings can be utilized such as a polyurethane base material further mixed with either carbon, graphite, copper or chromium powder. The particle size of the powder will be in the range of 1 micron to 5 microns.

Another commercial sublayer coating is sold by the Bee Chemical Co., Chicago, Illinois, and includes a base material Model No. 472A and a catalyst Model No. 472B. A mixture of approximately 63% of the base with 37% of the catalyst can be appropriately thinned with turpentine or mineral spirits to permit adequate spraying conditions. The coated subpart is then dried and cured at 165° F. for approximately two hours.

Another epoxy sublayer is sold by the Able Stik Company of Gardena, California, as Model No. 342-4. This material can be sprayed on the subpart and then dried and cured at 165° F. for one hour.

After the sprayed subpart has been adequately cured, it can then be placed within the pressure vessel 24 and flushed with argon gas. The argon gas can then be evacuated until it is approximately $1.2 \times 10^{-2}$ torr by the vacuum pump 26. The camera subpart 28 can then be plasma etched for approximately two minutes at a frequency of 13.58 megahertz and 500 watts. The plane disc magnetron having a diameter of 10 centimeters can be utilized at 425 volts and 3.5 amps. The subpart 28 can be placed on a turn table 32 so that it is rotated during the sputtering. This rotation is important in permitting the sample to remain at a temperature close to room temperature and in permitting an extended period of time of sputtering without deforming the part. The part is effectively about 13 centimeters from the target.

The actual sputtering rate can be reduced to approximately one-seventh that of the time that would be required in a stationary sputtering condition. For example, to attain a thickness of 1 micron of copper, sputtering can be accomplished for approximately 45 minutes. This sputtering is accomplished with 425 volts and 3.5 amps. The target in the pressure vessel can be changed to chromium and the voltage adjusted to 375 volts at 3.5 amps. The pressure of argon is kept constant. The chromium sputtering is relatively slow compared to the copper and it takes approximately 36 minutes to obtain a thickness of about 0.3 microns.

Tests with the standard scotch tape and pencil erasers disclose superior abrasion resistance. The two metal layers, copper and chromium, adhere strongly to each other and it was impossible to separate them at the boundary of the sublayer. While the camera part 18 was disclosed as a glass filled polycarbonate, it should be realized that polyethylene and styrene materials could also be utilized with a superior abrasion resistant metal coating that can be subject to extreme temperature changes during the utilization of the camera.

While examples of the preferred embodiments and processes have been disclosed herein, it should be recognized that other modifications would be possible within the spirit of the present invention and accordingly, the scope of the present invention should be measured solely from the following claims wherein I claim:

What is claimed is:

1. An improved fiber reinforced plastic article having an exterior decorative metal coating formed by a process of preliminary preparation of the plastic surface with a gas plasma etching comprising:
   - an article substrate having at least one portion formed from a molded plastic material having a gas plasma etched surface, the surface configuration being characteristic of gas plasma etching for a sufficient period of time to deteriorate the cross linkage of bonds between the plastic polymers adjacent the surface without outgassing any significant material to effect the subsequent metal coating, and
   - an exterior metallized coating on the gas plasma etched surface including a first layer adjacent the plastic material of a first metal transitional element and a second exterior layer on the first metal transitional element layer of a second metal transitional element.

2. The invention of claim 1 wherein the article substrate surface has been plasma etched preparatory to receiving the first layer, the plasma etching is done for approximately two minutes at approximately 13.6 megahertz at about 500 watts in an environment of argon gas at $10^{-2}$ torr.

3. The invention of claim 1 wherein the first metal transitional element is a copper layer approximately 1 to 3 microns in thickness.

4. The invention of claim 3 wherein the second metal transitional element is a chromium layer approximately 0.2 to 0.5 microns in thickness.

5. The invention of claim 3 further including a sublayer coating between the copper layer and the molded plastic material.

6. The invention of claim 5 wherein the sublayer coating is a plastic epoxy.

7. The invention of claim 5 wherein the sublayer coating is a polyurethane material.

8. The invention of claim 7 wherein the sublayer coating further has particles of powder of approximately 1 to 5 microns in size.

9. The invention of claim 8 wherein the particles of powder are selected from a group consisting of carbon, graphite, copper and chromium.

10. In an improved plastic camera housing of fiber reinforced plastic material such as a glass fiber filled polycarbonate plastic formed by a process of preliminary preparation of the plastic surface with plasma etching, the improvement comprising;
  at least one portion of the camera housing having a plasma etched surface with a metallized coating, the coating including a first layer adjacent the plastic housing of approximately 1 to 3 microns of thickness of sputtered copper deposited in an inert subatmospheric environment and a second exterior layer of chromium of at least approximately 0.2 to 0.5 microns deposited in an inert subatmospheric environment onto the copper layer, the plastic housing portion surface has been plasma etched preparatory to receiving the first layer, the plasma etching was done for approximately two minutes at approximately 13.6 megahertz at about 500 watts in an environment of argon gas at approximately $10^{-2}$ torr.

11. The invention of claim 10 wherein the first layer is deposited in an atmosphere of argon gas at a pressure of approximately $10^{-2}$ torr.

* * * * *